(12) United States Patent
Kim

(10) Patent No.: US 12,739,984 B2
(45) Date of Patent: Sep. 15, 2026

(54) DISPLAY DEVICE

(71) Applicant: Samsung Display Co., LTD., Yongin-si (KR)

(72) Inventor: Seon-Kyong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 234 days.

(21) Appl. No.: 18/408,046

(22) Filed: Jan. 9, 2024

(65) Prior Publication Data

US 2024/0306320 A1 Sep. 12, 2024

(30) Foreign Application Priority Data

Mar. 8, 2023 (KR) ........................ 10-2023-0030658

(51) Int. Cl.
*H05K 1/11* (2006.01)
*H05K 5/00* (2006.01)
*H10W 90/00* (2026.01)

(52) U.S. Cl.
CPC ........... *H05K 5/0069* (2013.01); *H05K 1/111* (2013.01); *H05K 2201/2036* (2013.01); *H10W 90/00* (2026.01)

(58) Field of Classification Search
CPC .... H05K 5/0069; H05K 1/111; H01L 25/162; H01L 25/167
USPC .......................................................... 361/748
See application file for complete search history.

(56) References Cited

U.S. PATENT DOCUMENTS 10,791,636 B2 * 9/2020 Andou ............... H05K 13/0015
2008/0106874 A1 * 5/2008 Okuda ................ H05K 1/0281 361/749
2014/0217382 A1 * 8/2014 Kwon ................ H10K 50/8426 257/40
2018/0019417 A1 * 1/2018 Andou .................. H05K 1/028
2018/0027673 A1 * 1/2018 Andou .................. H10K 71/00 361/749

* cited by examiner

*Primary Examiner* — Binh B Tran
(74) *Attorney, Agent, or Firm* — CANTOR COLBURN LLP

(57) ABSTRACT

A display device includes a display panel including a display area, a pad area spaced apart from the display area, and a bending area adjacent to the display area in a first direction, disposed between the display area and the pad area, and bent from the display area, a window member disposed on a first surface of the display panel, and a spacer disposed on a second surface of the display panel opposite to the first surface and overlapping the display area and the pad area. A first opening pattern is defined at an end portion of the spacer.

18 Claims, 7 Drawing Sheets

FIG. 4

DISPLAY DEVICE

This application claims priority to Korean Patent Application No. 10-2023-0030658, filed on Mar. 8, 2023, and all the benefits accruing therefrom under 35 U.S.C. § 119, the content of which in its entirety is herein incorporated by reference.

BACKGROUND

1. Field

The disclosure relates to a display device. More specifically, the disclosure relates to a flexible display device.

2. Description of the Related Art

As information technology develops, an importance of a display device as a connection medium between a user and information is being highlighted. A use of display devices such as a liquid crystal display device ("LCD"), an organic light-emitting display device ("OLED"), a plasma display device ("PDP"), and/or a quantum dot display device, is increasing.

By bending at least a portion of the display device, visibility at various angles may be improved or the area of the non-display area may be reduced. In a process of manufacturing such a display device in which at least a part is bent, a method of minimizing defects is being sought.

SUMMARY

Embodiments provide a display device with improved display quality.

A display device in an embodiment may include a display panel including a display area, a pad area spaced apart from the display area, and a bending area adjacent to the display area in a first direction, disposed between the display area and the pad area, and bent from the display area, a window member disposed on a first surface of the display panel, and a spacer disposed on a second surface of the display panel opposite to the first surface and overlapping the display area and the pad area. A first opening pattern is defined at an end portion of the spacer.

In an embodiment, the spacer may include polyethylene terephthalate.

In an embodiment, the first opening pattern may include a plurality of first openings arranged in at least one row in a plan view.

In an embodiment, a size of each of the plurality of first openings in the first direction may be in a range of about 0.1 millimeter (mm) to about 0.3 mm.

In an embodiment, the plurality of first openings may be arranged in two rows, and the two rows may be spaced apart from each other by a range of about 0.1 mm to about 0.3 mm along the first direction which is a column direction.

In an embodiment, the display device may further include a printed circuit board connected to the display panel in the pad area and a conductive tape disposed between the printed circuit board and the display panel.

In an embodiment, the conductive tape may be disposed on the second surface of the display panel.

In an embodiment, a second opening pattern may be defined at an end portion of the conductive tape.

In an embodiment, the end portion of the conductive tape may be adjacent to the end portion of the spacer.

In an embodiment, the second opening pattern may include a plurality of second openings arranged in at least one row in a plan view.

In an embodiment, a size of each of the plurality of second openings in the first direction may be in a range of about 0.1 mm to about 0.3 mm.

In an embodiment, the plurality of second openings may be arranged in two rows, and the two rows may be spaced apart from each other by a range of about 0.1 mm to about 0.3 mm along the first direction which is a column direction.

In an embodiment, the display device may further include an adhesive member disposed between the window member and the display panel.

In an embodiment, the adhesive member may include optically clear adhesive.

In an embodiment, the display device may further include a driving integrated circuit disposed on the first surface of the display panel and overlapping the pad area.

A display device in an embodiment may include a display panel including a display area, a pad area spaced apart from the display area, and a bending area adjacent to the display area in a first direction, disposed between the display area and the pad area, and bent from the display area, a window member disposed on a first surface of the display panel, a spacer disposed on a second surface of the display panel opposite to the first surface and overlapping the display area and the pad area, a printed circuit board connected to the display panel in the pad area, and a conductive tape disposed between the printed circuit board and the display panel and disposed on the second surface of the display panel. A first opening pattern is defined at an end portion of the spacer and a second opening pattern is defined at an end portion of the conductive tape adjacent to the first opening pattern in the first direction.

In an embodiment, a shape of the first opening pattern and a shape of the second opening pattern may be same.

In an embodiment, each of the first opening pattern and the second opening pattern may include a plurality of openings arranged in at least one row.

In an embodiment, a size of each of the plurality of openings in the first direction may be in a range of about 0.1 mm to about 0.3 mm.

In an embodiment, each of the first opening pattern and the second opening pattern may include a plurality of openings arranged in two rows, and the two rows are spaced apart from each other by a range of about 0.1 mm to about 0.3 mm along the first direction which is a column direction.

In the display device in embodiments, since the display device includes a spacer and a conductive tape having opening patterns respectively defined at one end portion, pressure transmitted through the spacer and the conductive tape may be dispersed by the first opening pattern and the second opening pattern. Through this, pressure applied intensively to a portion of the adhesive member overlapping the spacer and the conductive tape may be dispersed. That is, since pressure applied to one end portion of the spacer and one end portion of the conductive tape is dispersed and the pressure is not relatively concentrated, occurrence of concavo-convex of the adhesive member adjacent to one end portion of the spacer and one end portion of the conductive tape may be reduced or prevented.

Since there is no sudden pressure change between an empty space between the spacer and the conductive tape and between one end portion of the spacer and one end portion of the conductive tape, concavo-convex of the adhesive member may be reduced or prevented. By reducing or preventing concavo-convex of the adhesive member, visibility through the window member and display quality may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 4 is a cross-sectional view illustrating a display panel included in the display device of FIG. 3.

DETAILED DESCRIPTION

Figure 1:
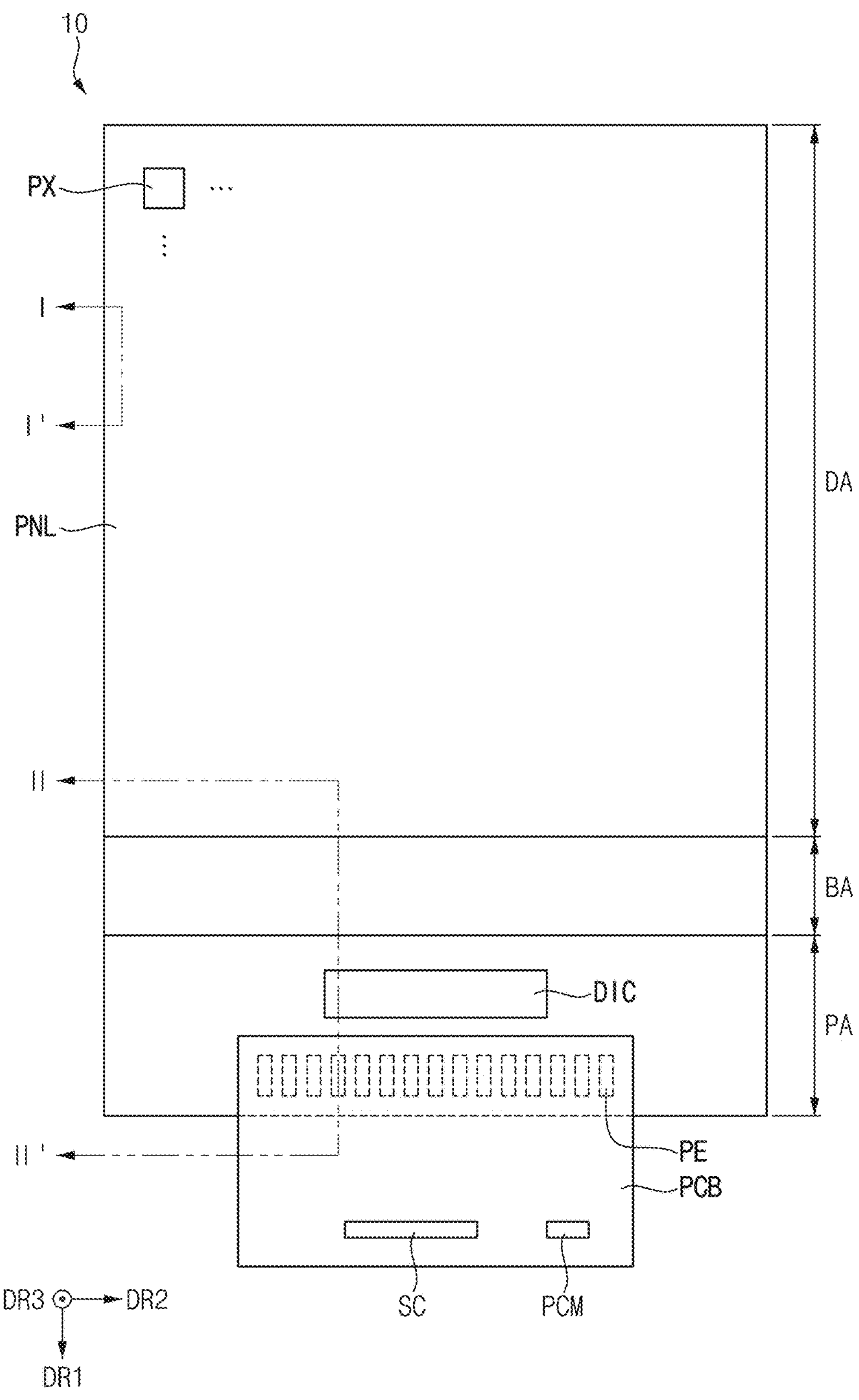
FIG. 1 is a plan view illustrating an embodiment of a display device.

Embodiments of the disclosure now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
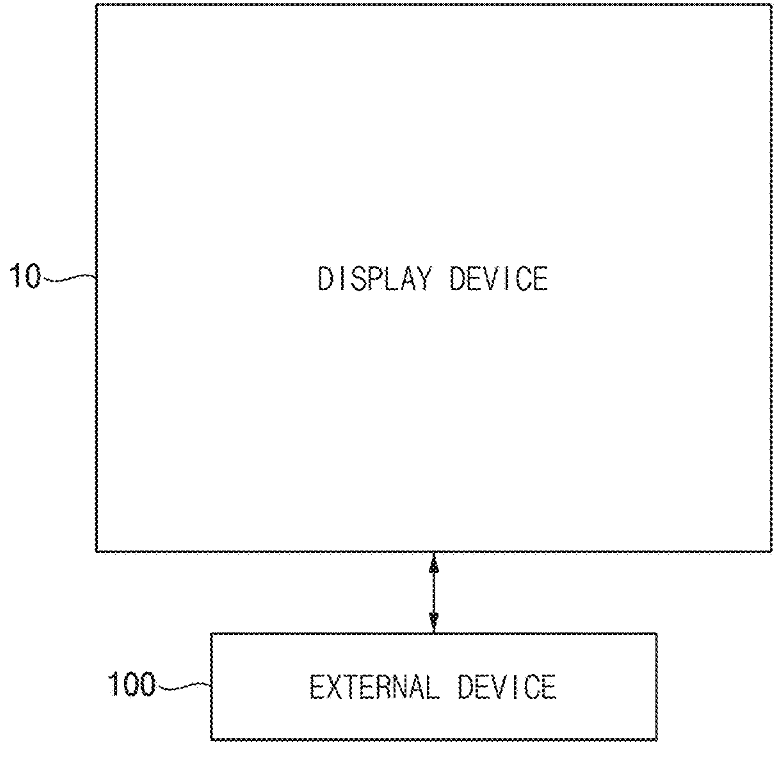
FIG. 2 is a block diagram illustrating an external device electrically connected to the display device of FIG. 1.

FIG. 1 is a plan view illustrating an embodiment of a display device. FIG. 2 is a block diagram illustrating an external device electrically connected to the display device of FIG. 1.

In an embodiment, the display device 10 illustrated in FIG. 1 is in a state before a display panel PNL is bent, for example.

Referring to FIG. 1, a display device 10 in an embodiment may include a display panel PNL, a driving integrated circuit DIC, a printed circuit board PCB, a signal control circuit SC, and a power control module PCM. Here, the display panel PNL may include pad electrodes PE and a plurality of pixels PX.

The display panel PNL may include a display area DA, a bending area BA, and a pad area PA. The pad area PA may be spaced apart from the display area DA. Specifically, the pad area PA may be spaced apart from one side of the display area DA in the first direction DR1. The bending area BA may be disposed between the display area DA and the pad area PA in a plan view. That is, the bending area BA may be adjacent to the display area DA in the first direction DR1. Also, the bending area BA may be bent from the display area DA.

Referring further to FIG. 2, an external device 100 may be electrically connected to the display device 10. In an embodiment, the external device 100 may be electrically connected to the display device 10 through the printed circuit board PCB, for example. The external device 100 may generate electrical signals and voltages to display images on the display panel PNL.

The pad electrodes PE may be disposed in the pad area PA. The pad electrodes PE may be spaced apart from each other in the second direction DR2. Here, the second direction DR2 may be a direction crossing the first direction DR1. Some of the pad electrodes PE may be connected to the driving integrated circuit DIC through a wire, and the others of the pad electrodes PE may be connected to the plurality of pixels PX through a wire. In an embodiment, each of the pad electrodes PE may include a metal, an alloy, a metal nitride, a conductive metal oxide, a transparent conductive material, or the like, for example. These may be used alone or in any combinations with each other.

The printed circuit board PCB may be connected to the display panel PNL in the pad area PA. Specifically, one end of the printed circuit board PCB may be electrically connected to the pad electrodes PE of the display panel PNL. The other end of the printed circuit board PCB may be electrically connected to the external device 100. That is, the electrical signal, the voltage, or the like generated from the external device 100 may be provided to the driving integrated circuit DIC and the plurality of pixels PX through the printed circuit board PCB.

Components for receiving electrical signals or voltages supplied from the external device 100 and transmitting the electrical signals or voltages to the display panel PNL may be disposed on the printed circuit board PCB. In an embodiment, the signal control circuit SC for controlling electrical signals provided to the display panel PNL may be disposed on the printed circuit board PCB, for example. Also, the power control module PCM for controlling the voltage provided to the display panel PNL may be disposed on the printed circuit board PCB.

The driving integrated circuit DIC may be disposed on the display panel PNL. The driving integrated circuit DIC may overlap the pad area PA. The driving integrated circuit DIC may convert a digital data signal among the electrical signals into an analog data signal and provide the converted analog data signal to the plurality of pixels PX. In an embodiment, the driving integrated circuit DIC may be a data driver, for example. Optionally, the display device 10 may further include a gate driver. In this case, the gate driver may be disposed on one side of the display area DA.

The plurality of pixels PX may be disposed in the display area DA. Each of the plurality of pixels PX may emit light. The plurality of pixels PX may be arranged in the first direction DR1 and the second direction DR2 in the display area DA. Here, the second direction DR2 may be a direction substantially orthogonal to the first direction DR1. Wires connected to the plurality of pixels PX may be further disposed in the display area DA. In an embodiment, the wires may include a data signal wire, a gate signal wire, and a power wire, for example.

However, although each of the display area DA, the bending area BA, and the pad area PA of the invention is illustrated in FIG. 1 as having a quadrangular, e.g., rectangular planar shape, the invention is not limited thereto. In an embodiment, each of the display area DA, the bending area BA, and the pad area PA may have a triangular planar shape, a rhombic planar shape, a circular planar shape, a track-shaped planar shape, or an elliptical planar shape, for example.

In addition, although a chip on plastic ("COP") structure or a chip on glass ("COG") structure in which the driving integrated circuit DIC is directly disposed on the display panel is illustrated in FIG. 1, the invention is not limited thereto. In an embodiment, the driving integrated circuit DIC may have a chip on film ("COF") structure directly disposed on a flexible film, for example. In this case, the printed circuit board PCB may be electrically connected to the flexible film.

Figure 3:
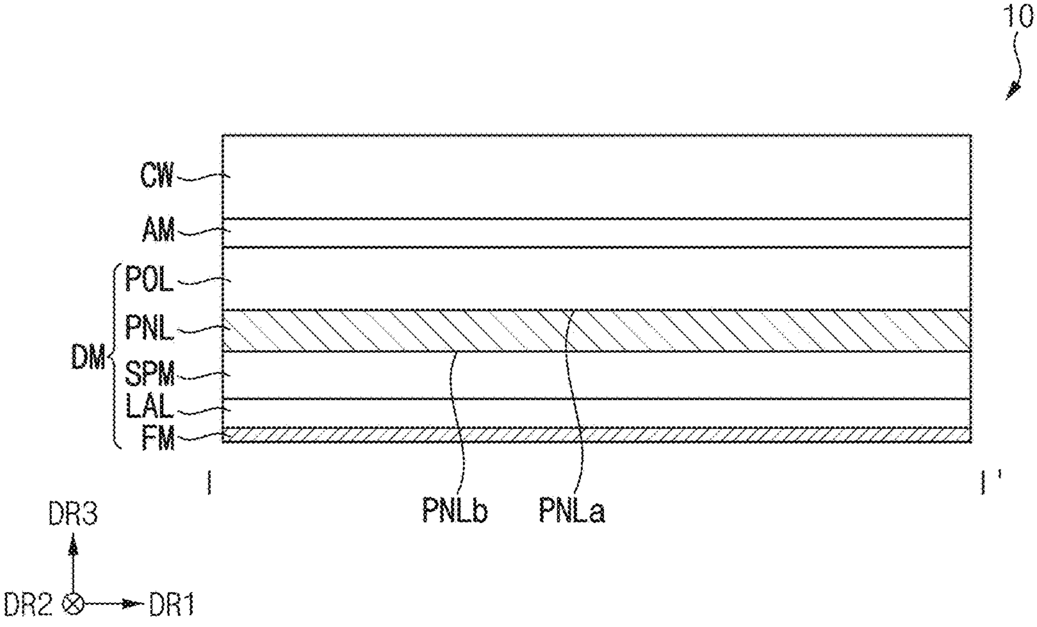
FIG. 3 is a cross-sectional view taken along line I-I' of FIG. 1.

FIG. 3 is a cross-sectional view taken along line I-I' of FIG. 1.

Referring to FIG. 3, the display device 10 may include a window member CW, an adhesive member AM, and a display module DM. The display module DM may include a polarization layer POL, the display panel PNL, a support member SPM, a lower adhesive layer LAL, and a functional layer FM. However, the invention is not limited thereto, and the polarization layer POL, the support member SPM, the lower adhesive layer LAL, and the functional layer FM may be omitted in the display module DM.

The display panel PNL may include a first surface PNLa and a second surface PNLb. The first surface PNLa may display a screen, and the second surface PNLb may be a surface opposite to the first surface PNLa.

The polarization layer POL may be disposed on the first surface PNLa of the display panel PNL. The polarization layer POL may reduce reflection of external light of the display device 10. In an embodiment, external light may pass through the polarization layer POL, be reflected from a lower portion of the polarization layer POL (e.g., the display panel PNL), and then pass through the polarization layer POL again, for example. In this case, a phase of the external light may change as it passes through the polarization layer POL twice. Accordingly, since the phase of the reflected light is different from the phase of the incident light entering the polarization layer POL, destructive interference may occur. Accordingly, visibility of the display device 10 may be improved by reducing reflection of external light.

The adhesive member AM may be disposed on the polarization layer POL. The adhesive member AM may connect the polarization layer POL and the window member CW. In an embodiment, the adhesive member AM may include optically clear adhesive ("OCA"), for example. However, the invention is not limited thereto, and in another embodiment, the adhesive member AM may include a pressure sensitive adhesive ("PSA"), an optically clear resin ("OCR"), or the like.

The window member CW may be disposed on the adhesive member AM. The window member CW may protect the display panel PNL from external impurities and impact. In an embodiment, the window member CW may include flexible transparent glass or transparent plastic. In an embodiment, the window member CW may include ultra-thin glass ("UTG"), reinforced plastic, polyimide ("PI"), or the like, for example. Although not shown in FIG. 2, functional layers such as an anti-reflection layer, a hard coating layer, and an anti-fingerprint layer may be disposed on the window member CW.

A window protection layer may be additionally disposed on the window member CW. The window protective layer may protect the window member CW from external impurities, impact, or the like.

The support member SPM may be disposed under the display panel PNL. The support member SPM may absorb an external impact from the lower portion of the display device 10. Accordingly, the support member SPM may protect the second surface PNLb of the display panel PNL from external impact.

The lower adhesive layer LAL may be disposed under the support member SPM. The lower adhesive layer LAL may connect the support member SPM and the functional layer FM. In an embodiment, the lower adhesive layer LAL may include an optically clear adhesive ("OCA"), for example. However, the invention is not limited thereto, and in another embodiment, the lower adhesive layer LAL may include a pressure sensitive adhesive ("PSA"), an optically clear resin ("OCR"), or the like.

The functional layer FM may be disposed under the lower adhesive layer LAL. The functional layer FM may include a digitizer, a heat dissipation layer, a cushion layer, or the like. In an embodiment, the digitizer may be a device which converts coordinates of the input unit into digital data when the input unit, such as a pen, touches the window member CW, for example. The digitizer may operate using an electromagnetic resonance method. Also, the heat dissipation layer may dissipate heat transmitted to the first surface PNLa of the display panel PNL. The heat dissipation layer may include a material having relatively high thermal conductivity. In an embodiment, the heat dissipation layer may include graphite, for example. Optionally, the heat dissipation layer may include aluminum (Al), an alloy including or consisting of aluminum, copper (Cu), an alloy including or consisting of copper, silver (Ag), an alloy including or consisting of silver, or the like. These may be used alone or in any combinations with each other. In addition, the cushion layer may be disposed under the display panel PNL to mitigate an impact of the display panel PNL. In an embodiment, the cushion layer may include a material capable of buffering by including or consisting of air, such as a cushion or a sponge. In addition, the functional layer FM may include acrylic resin, polyurethane, thermoplastic polyurethane, latex, polyurethane foam, polystyrene foam, or the like, for example. These may be used alone or in any combinations with each other.

Although not shown in FIG. 3, adhesive layers may be disposed between the display panel PNL and the support member SPM and between the display panel PNL and the polarization layer POL, respectively. The adhesive layers may include a pressure sensitive adhesive ("PSA"), an optically clear adhesive ("OCA"), an optically clear resin ("OCR"), or the like.

Figure 4:
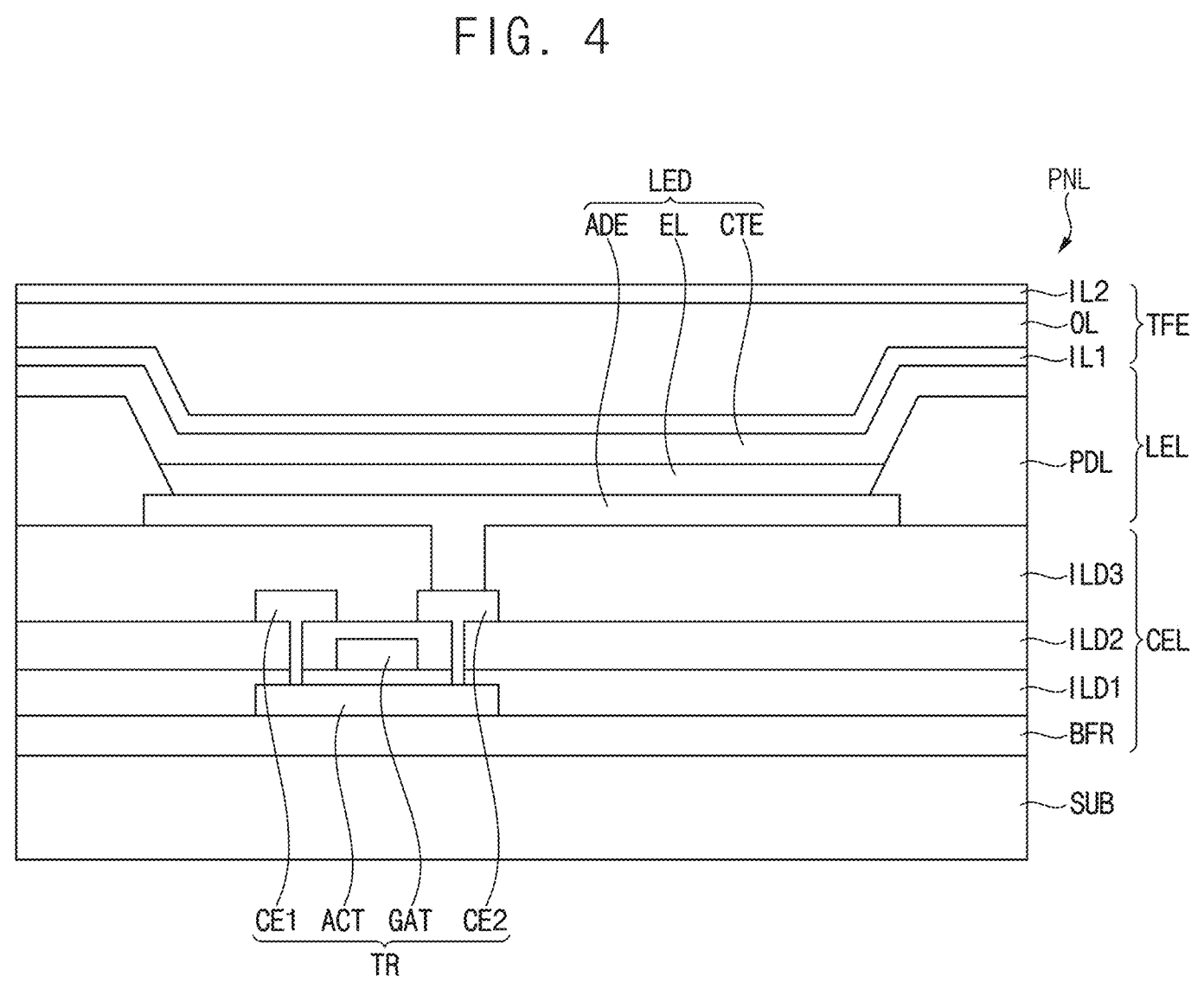

FIG. 4 is a cross-sectional view illustrating a display panel included in the display device of FIG. 3.

Referring to FIGS. 1 and 4, the display panel PNL may include a substrate SUB, a circuit element layer CEL, a light-emitting element layer LEL, and an encapsulation layer TFE. The circuit element layer CEL may be disposed in the display area DA on the substrate SUB. The circuit element layer CEL may include a buffer layer BFR, at least one transistor TR, and first to third insulating layers ILD1, ILD2, and ILD3. The light-emitting element layer LEL may be disposed in the display area DA on the circuit element layer CEL. The light-emitting element layer LEL may include at least one light-emitting diode LED and a pixel defining layer PDL. The encapsulation layer TFE may be disposed on the light-emitting element layer LEL.

The transistor TR may include an active pattern ACT, a gate electrode GAT, a first connection electrode CE1, and a second connection electrode CE2. The transistor TR may be electrically connected to the pad electrodes PE of FIG. 1.

The light-emitting diode LED may include a pixel electrode ADE, a light-emitting layer EL and a common electrode CTE.

The substrate SUB may include or consist of a transparent or opaque material. In an embodiment, the substrate SUB may include or consist of glass, quartz, or plastic. In embodiments, plastics that may be used as the substrate SUB may include polyethylene terephthalate ("PET"), polyimide ("PI"), polyether sulfone ("PS"), polyacrylate ("PAR"), polyetherimide ("PEI"), polyethylene naphthalate ("PEN"), polyphenylene sulfide ("PPS"), polyarylate, polycarbonate ("PC"), polyarylene ether sulfone, or the like, for example. In this case, the substrate SUB may include a plurality of polyimide layers and barrier layers disposed between the polyimide layers, respectively.

The buffer layer BFR may be disposed on the substrate SUB. In an embodiment, the buffer layer BFR may include an inorganic material. In an embodiment, materials that may be used as the buffer layer BFR may include silicon oxide, silicon nitride, silicon oxynitride, or the like, for example. These may be used alone or in any combinations with each other.

The buffer layer BFR may prevent diffusion of metal atoms or impurities from the substrate SUB into the active pattern ACT. Also, the buffer layer BFR may control a heat supply rate during a crystallization process for forming the active pattern ACT.

The active pattern ACT may be disposed on the buffer layer BFR. In an embodiment, the active pattern ACT may be a silicon semiconductor or an oxide semiconductor. In an embodiment, materials that may be used as the active pattern ACT may include amorphous silicon, polycrystalline silicon, metal oxide, or the like, for example. These may be used alone or in any combinations with each other.

The first insulating layer ILD1 may be disposed on the active pattern ACT. The first insulating layer ILD1 may include or consist of an insulating material. In embodiments, an insulating material that may be used as the first insulating layer ILD1 may include silicon oxide, silicon nitride, silicon oxynitride, or the like. These may be used alone or in any combinations with each other. In an embodiment, as shown in FIG. 4, the first insulating layer IDL1 may be entirely formed on the buffer layer BFR to cover the active pattern ACT. However, the invention is not limited thereto, and in another embodiment, the first insulating layer ILD1 may be disposed on the active pattern ACT in a pattern form.

The gate electrode GAT may be disposed on the first insulating layer ILD1 and may overlap the active pattern ACT. In an embodiment, the gate electrode GAT may include a metal, an alloy, a conductive metal oxide, a transparent conductive material, or the like. In embodiments, materials that may be used as the gate electrode GAT may include silver (Ag), an alloy including or consisting of silver, molybdenum (Mo), an alloy including or consisting of molybdenum, aluminum (Al), an alloy including or consisting of aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like, for example. These may be used alone or in any combinations with each other.

The second insulating layer ILD2 may cover the gate electrode GAT and may be disposed on the buffer layer BFR. In an embodiment, the second insulating layer ILD2 may include an inorganic insulating material. In an embodiment, materials that may be used as the second insulating layer ILD2 may include silicon oxide, silicon nitride, silicon oxynitride, or the like, for example. These may be used alone or in any combinations with each other.

The first connection electrode CE1 and the second connection electrode CE2 may be disposed on the second insulating layer ILD2. The first connection electrode CE1 and the second connection electrode CE2 may contact the active pattern ACT. The first connection electrode CE1 and the second connection electrode CE2 may include a metal such as aluminum (Al), titanium (Ti), or copper (Cu).

The third insulating layer ILD3 may be disposed on the first connection electrode CE1 and the second connection electrode CE2. The third insulating layer ILD3 may include an organic insulating material such as polyimide and/or an inorganic insulating material such as silicon nitride or silicon oxide. The third insulating layer ILD3 may have a multilayer structure.

The pixel electrode ADE may be disposed on the third insulating layer ILD3. The pixel electrode ADE may be connected to the first connection electrode CE1 or the second connection electrode CE2. The pixel electrode ADE may include a metal, an alloy, a conductive metal oxide, a transparent conductive material, or the like. In an embodiment, materials that may be used as the pixel electrode ADE may include silver (Ag), an alloy including or consisting of silver, molybdenum (Mo), an alloy including or consisting of molybdenum, aluminum (Al), and aluminum. Alloy including or consisting of, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like, for example. These may be used alone or in any combinations with each other.

The pixel defining layer PDL may be disposed on the pixel electrode ADE. In an embodiment, the pixel defining layer PDL may include an organic insulating material. A pixel opening exposing an upper surface of the pixel electrode ADE may be defined in the pixel defining layer PDL.

The light-emitting layer EL may be disposed on the pixel electrode ADE exposed through the pixel opening. In an embodiment, the light-emitting layer EL may be separated from the light-emitting layer of an adjacent pixel. In another embodiment, the light-emitting layer EL may continuously extend on the pixel electrode ADE and the pixel defining layer PDL.

The common electrode CTE may be disposed on the light-emitting layer EL. The common electrode CTE may include a conductive material such as a metal, an alloy, a conductive metal nitride, a conductive metal oxide, or a transparent conductive material. The common electrode CTE may have a single-layer structure or a multi-layer structure including a plurality of conductive layers. The light-emitting layer EL may emit light based on a voltage difference between the pixel electrode ADE and the common electrode CTE.

The encapsulation layer TFE may be disposed on the common electrode CTE. The encapsulation layer TFE may include at least one inorganic encapsulation layer and at least one organic encapsulation layer. In an embodiment, the encapsulation layer TFE may include a first inorganic encapsulation layer IL1 disposed on the common electrode CTE and an organic encapsulation layer OL disposed on the first inorganic encapsulation layer IL1, and a second inorganic encapsulation layer IL2 disposed on the organic encapsulation layer OL. The encapsulation layer TFE may prevent foreign matter from penetrating into the light-emitting diode LED.

Figure 5:
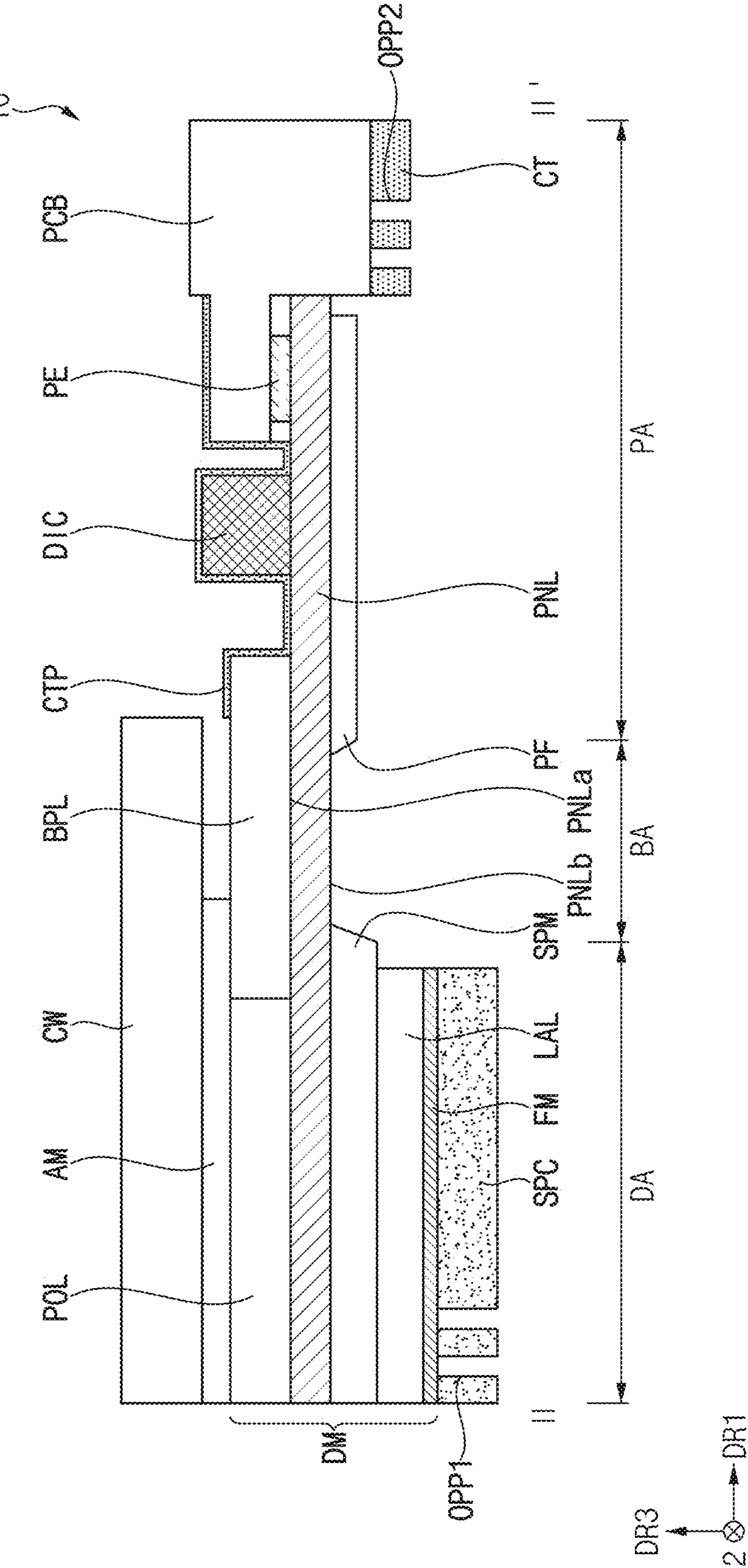
FIG. 5 is a cross-sectional view taken along line II-II' of FIG. 1.
Figure 6:
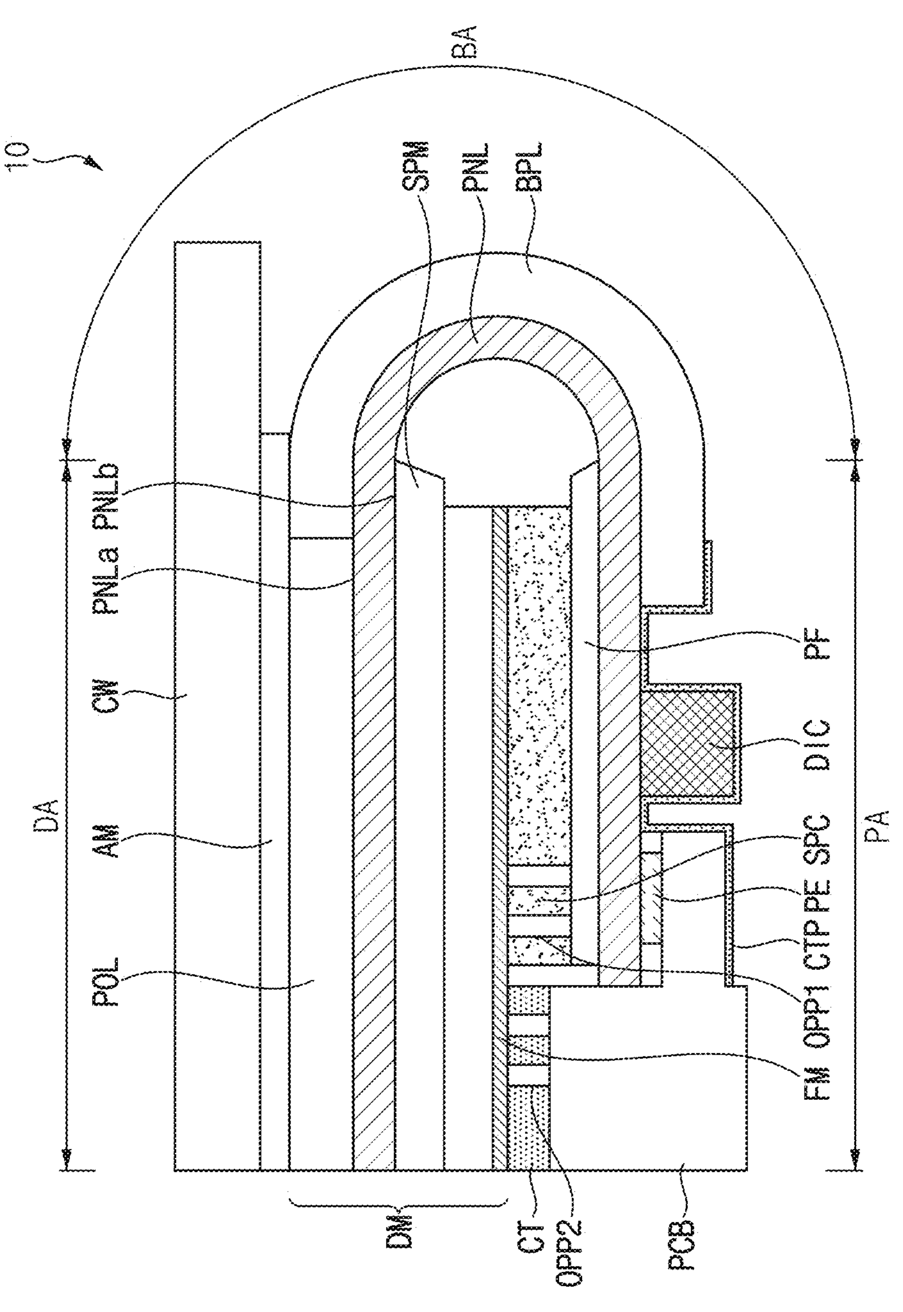
FIG. 6 is a cross-sectional view illustrating a bent shape of the display device of FIG. 5.
Figure 6:
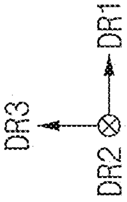

FIG. 5 is a cross-sectional view taken along line II-II' of FIG. 1. FIG. 6 is a cross-sectional view illustrating a bent shape of the display device of FIG. 5.

In an embodiment, the bending area BA of the display device 10 may be bent from the display area DA, for example. The display device 10 shown in FIG. 5 is in a state before the display panel PNL is bent, and the display device 10 shown in FIG. 6 is in a state where the display panel PNL is bent. In the display device 10, the bending area BA of the display panel PNL may be provided in a bent state.

Referring to FIGS. 5 and 6, the display device 10 in an embodiment may include the window member CW, the adhesive member AM, the display module DM, a bending protection layer BPL, a spacer SPC, a conductive tape CT, the drive integrated circuit DIC, the printed circuit board PCB, a cover tape CTP, a pad electrode PE, and a protective film PF. The display module DM may include the polarization layer POL, the display panel PNL, the support member SPM, the lower adhesive layer LAL, and the functional layer FM.

The display panel PNL may include the first surface PNLa and the second surface PNLb. The polarization layer POL, the bending protection layer BPL, the adhesive member AM, the window member CW, the cover tape CTP, the driving integrated circuit DIC, and the pad electrode PE may be disposed on the first surface PNLa. The support member SPM, the protective film PF, the lower adhesive layer LAL, the functional layer FM, and the spacer SPC may be disposed on the second surface PNLb.

Also, the display panel PNL may extend from the display area DA to the pad area PA. In an embodiment, the substrate SUB included in the display panel PNL may extend from the display area DA to the pad area PA, for example. That is, the substrate SUB overlapping the bending area BA may be bent.

The protective film PF may be disposed on the second surface PNLb of the display panel PNL. The protective film PF may protect the second surface PNLb overlapping the pad area PA. The protective film PF may contact the spacer SPC after the display panel PNL is bent.

In an embodiment, the spacer SPC may be disposed on the second surface PNLb of the display panel PNL. Specifically, the spacer SPC may be disposed under the display module DM before the display panel PNL is bent. The spacer SPC may be disposed between the bent display panel PNL after the display panel PNL is bent. Also, after the display panel PNL is bent, the spacer SPC may simultaneously overlap the display area DA and the pad area PA in a third direction DR3. The third direction DR3 may be a direction crossing a plane defined by the first direction DR1 and the second direction DR2.

As shown in FIG. 6, when the bending area BA of the display panel PNL is bent, the spacer SPC may compensate for a step difference. Before the display panel PNL is bent, height levels of the printed circuit board PCB and the display panel PNL may be different from each other, which generates a step difference between the printed circuit board PCB and the display panel PNL when the display panel PNL is bent. Accordingly, a step difference between the display panel PNL and the printed circuit board PCB may be compensated for using the spacer SPC.

Optionally, the spacer SPC may further include adhesive layers on upper and lower surfaces. Accordingly, the spacer SPC may be fixed to the functional layer FM, and the protective film PF may be fixed after the display panel PNL is bent. The spacer SPC may include an organic material. In an embodiment, the spacer SPC may include PET, for example. However, the invention is not limited thereto, and in another embodiment, the spacer SPC may include polypropylene ("PP"), PC, polyethylene ("PE"), or the like. These may be used alone or in any combinations with each other.

The bending protection layer BPL may be disposed on the display panel PNL. The bending protection layer BPL may protect the bending area BA of the display panel PNL. The bending protection layer BPL may overlap the bending area BA, and may also overlap a portion of the display area DA and a portion of the pad area PA. The bending protection layer BPL may include a photocurable resin or a thermosetting resin. In an embodiment, the bending protection layer may include epoxy resin, amino resin, phenol resin, urea resin, melamine resin, unsaturated polyester resin, polyurethane resin, polyimide resin, or the like, for example. These may be used alone or in any combinations with each other.

The adhesive member AM may be disposed on the display module DM. Specifically, the adhesive member AM may be disposed on the polarization layer POL and the bending protection layer BPL. The adhesive member AM may overlap the display area DA, and may overlap a portion of the bending protection layer BPL and the polarization layer POL. The adhesive member AM may adhere the window member CW to the display module DM. In an embodiment, the adhesive member AM may include an optically clear adhesive ("OCA"), for example. However, the invention is not limited thereto, and in another embodiment, the adhesive member AM may include a pressure sensitive adhesive ("PSA"), an optically clear resin ("OCR"), or the like.

The window member CW may be disposed on the adhesive member AM. The window member CW may overlap the display area DA. The window member CW may protect the polarization layer POL, the bending protection layer BPL, and the display panel PNL. The window member CW may include ultra-thin glass ("UTG"), reinforced plastic, polyimide ("PI"), or the like. Optionally, the window member CW may include or consist of a single layer or may have a structure in which a plurality of functional layers are stacked.

The conductive tape CT may be disposed on the second surface PNLb of the display panel PNL. That is, the conductive tape CT may attach the printed circuit board PCB to the display module DM. The conductive tape CT may be disposed between the printed circuit board PCB and the display panel PNL after the display panel PNL is bent. That is, the conductive tape CT may overlap the printed circuit board PCB and the display panel PNL in the third direction DR3.

As shown in FIG. 6, when a portion of the display panel PNL overlapping the bending area BA is bent, the conductive tape CT may compensate for a step difference. Before the display panel PNL is bent, a step difference between the printed circuit board PCB and the display panel PNL may be different from each other. Accordingly, a step difference between the display panel PNL and the printed circuit board PCB may be compensated for using the conductive tape CT. That is, a step difference between the display panel PNL and the printed circuit board PCB may be compensated for using the conductive tape CT and the spacer SPC overlapping the display panel PNL.

The conductive tape CT may further include an adhesive material. The conductive tape CT may be attached to the printed circuit board PCB, and may be fixed to the functional layer FM after the display panel PNL is bent. In an embodiment, the conductive tape CT may include an anisotropic conductive film, for example.

The cover tape CTP may be disposed on the pad area PA on the driving integrated circuit DIC. Also, the cover tape CTP may be disposed on a portion of the bending protection layer BPL and a portion of the printed circuit board PCB. In the pad area PA adjacent to the bending area BA, one end of the cover tape CTP may overlap the bending protection layer BPL, and the other end of the cover tape CTP may overlap the printed circuit board PCB. That is, the cover tape CTP may cover the driving integrated circuit DIC. In an embodiment, the cover tape CTP may include a synthetic resin such as polyethylene terephthalate ("PET"), for example.

However, the invention is not limited thereto, and in another embodiment, the cover tape CTP may contact only a portion of the bending protection layer BPL and a portion of the printed circuit board PCB. That is, the cover tape CTP may not contact the display panel PNL, and an empty space may be defined between the cover tape CTP and the display panel PNL.

Figure 7:
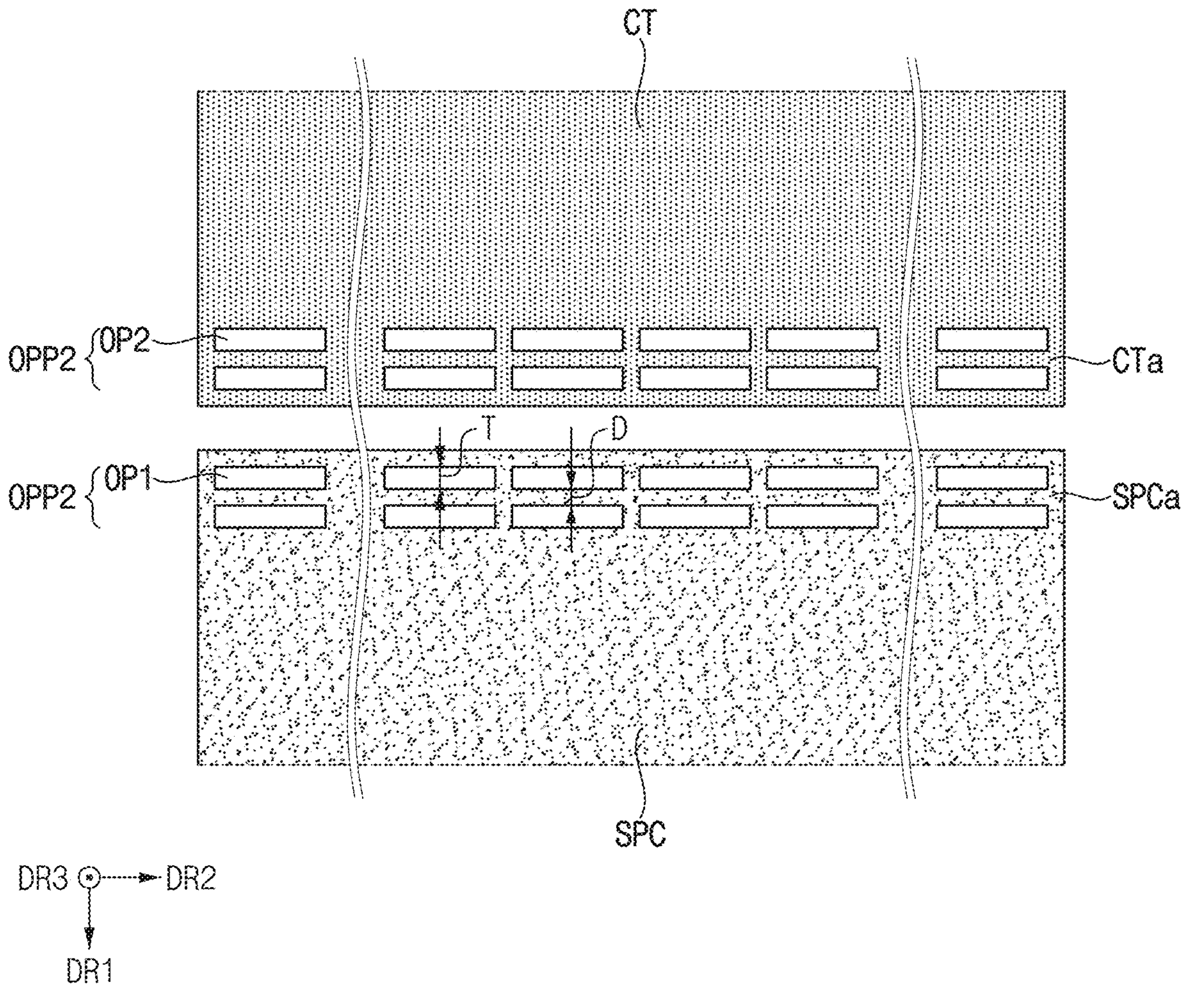
FIG. 7 is a plan view illustrating the spacer and the conductive tape of FIG. 6.

FIG. 7 is a plan view illustrating the spacer and the conductive tape of FIG. 6.

Referring further to FIG. 7, a first opening pattern OPP1 may be defined at one end portion SPCa of the spacer SPC. In addition, a second opening pattern OPP2 may be defined at one end portion CTa of the conductive tape CT.

The one end portion SPCa of the spacer SPC and the one end portion Cta of the conductive tape CT may be adjacent to each other in the first direction DR1. Accordingly, the first opening pattern OPP1 and the second opening pattern OPP2 may be adjacent to each other in the first direction DR1.

In an embodiment, a shape of the first opening pattern OPP1 and a shape of the second opening pattern OPP2 may be same, for example. However, the invention is not limited thereto.

The first opening pattern OPP1 may include a plurality of first openings OP1 arranged in one or more rows in a plan view. Similarly, the second opening pattern OPP2 may include a plurality of second openings OP2 arranged in one or more rows in a plan view. Here, a row direction may correspond to the second direction DR2, and a column direction may correspond to the first direction DR1. In an embodiment, each of the plurality of first openings OP1 and the plurality of second openings OP2 may be arranged in two rows, for example. However, the invention is not limited thereto.

Each of the plurality of first openings OP1 may have a quadrangular shape, e.g., rectangular shape. In the rectangular shape, a length in the second direction DR2 may be greater than a length in the first direction DR1. However, the invention is not limited thereto, and each of the plurality of first openings OP1 may have a circular, triangular, or polygonal shape over quadrangular.

When the display panel PNL is manufactured, the bending area BA of the display panel PNL may be bent. That is, the bending area BA may be bent in a direction in which the second surface PNLb of the display panel PNL face each other. In this case, the pad area PA of the display panel PNL may be disposed on the second surface PNLb overlapping the display area DA by the spacer SPC. Also, the printed circuit board PCB may be disposed on the second surface PNLb overlapping the display area DA through the conductive tape CT. After the display panel PNL is bent, the spacer SPC and the conductive tape CT may be pressed by pressing the display panel PNL and the printed circuit board PCB.

Through this, the display device 10 in which the bent state of the display panel PNL is fixed may be formed.

However, when the display panel PNL and the printed circuit board PCB are pressed, members under the display panel PNL and the printed circuit board PCB may be pressed. In particular, the adhesive member AM may be pressed. Since the adhesive member AM is an incompressible material, it may have a concavo-convex shape in which, when a portion of the adhesive member AM is pressed, another portion that is not pressed or weakly pressed protrudes. That is, since no pressure is transmitted to an empty space between the spacer SPC and the conductive tape CT, the concavo-convex may occur in a portion of the adhesive member AM which overlaps the empty space between the spacer SPC and the conductive tape CT.

In an embodiment, as the display device 10 includes the spacer SPC defining the first opening pattern OPP1 and the conductive tape CT defining the second opening pattern OPP2, pressure transmitted through the spacer SPC and the conductive tape CT may be dispersed by the first opening pattern OPP1 and the second opening pattern OPP2. Through this, the pressure applied intensively to a portion of the adhesive member AM which overlaps the spacer SPC and the conductive tape CT may be dispersed. That is, since the pressure applied to the one end portion SPCa of the spacer SPC and the one end portion Cta of the conductive tape CT is dispersed and the pressure is not relatively concentrated, the concavo-convex of the adhesive member AM adjacent to the one end portion SPCa of the spacer SPC and the one end portion Cta of the conductive tape CT may be reduced or prevented.

Since there is no sudden pressure change between the empty space between the spacer SPC and the conductive tape CT and between the one end portion SCPa of the spacer SPC and the one end portion Cta of the conductive tape CT, the concavo-convex of the adhesive member AM may be reduced or prevented. By reducing or preventing the concavo-convex of the adhesive member AM, visibility through the window member CW and display quality may be improved.

In an embodiment, a size T of the plurality of first openings OP1 in the first direction DR1 may in a range of about 0.1 millimeter (mm) to about 0.3 mm. When the plurality of first openings OP1 is arranged in two rows, the two rows may be spaced apart from each other by a range of about 0.1 mm to about 0.3 mm along the first direction DR1, which is a column direction. In this case, the size T of the plurality of first openings OP1 in the first direction DR1 and a distance D between the plurality of first openings OP1 in the first direction DR1 may be identical to each other. However, the invention is not limited thereto.

Also, the first opening pattern OPP1 may be spaced apart from one surface of the spacer SPC in a range of about 0.1 mm to about 0.3 mm along the first direction DR1.

When the plurality of first openings OP1 has a size smaller than about 0.1 mm, it may be difficult to form the first openings OP1 during a process. That is, process efficiency may decrease. When the plurality of first openings OP1 has a size larger than about 0.3 mm, the adhesive member AM may be modified as pressure is applied to portions of the spacer SPC adjacent to the plurality of first openings OP1. That is, the adhesive member AM may protrude in a direction to the plurality of first openings OP1 by receiving pressure from portions of the spacer SPC adjacent to the plurality of first openings OP1.

Similarly, when the two rows are separated by a distance smaller than about 0.1 mm along the first direction DR1, it may be difficult to form the first openings OP1 in a process. That is, process efficiency may decrease. In addition, when the two rows are separated by a distance greater than about 0.3 mm along the first direction DR1, it may be difficult to disperse a load concentrated on the one end portion SPCa of the spacer SPC. That is, as the distance between the two rows increases, the spacer SPC disposed between the two rows may press lower layers with a larger load. Accordingly, the adhesive member AM may protrude in the direction to the plurality of first openings OP1 by receiving pressure from portions of the spacer SPC adjacent to the plurality of first openings OP1.

Similarly, each of the plurality of second openings OP2 may have a quadrangular shape, e.g., rectangular shape. However, the invention is not limited thereto, and each of the plurality of second openings OP2 may have a circular, triangular, or polygonal shape over quadrangular.

In an embodiment, a size T of the plurality of second openings OP2 in the first direction DR1 may in a range of about 0.1 mm to about 0.3 mm. When the plurality of second openings OP2 is arranged in two rows, the two rows may be spaced apart from each other by a range of about 0.1 mm to about 0.3 mm along the first direction DR1, which is a column direction. That is, the size T of the plurality of second openings OP2 in the first direction DR1 and a distance D between the plurality of second openings OP2 in the first direction DR1 may be identical to each other. However, the invention is not limited thereto.

When the size T of the plurality of second openings OP2 in the first direction DR1 is in a range of about 0.1 mm to about 0.3 mm, the one end portion SPCa of the spacer SPC may effectively distribute the pressure when the bending area BA of the display panel PNL is bent and compressed. Similarly, when the two rows are spaced apart from each other by a range of about 0.1 mm to about 0.3 mm in the first direction DR1, the one end portion SPCa of the spacer SPC may effectively distribute the pressure when the bending area BA of the display panel PNL is bent and compressed.

Also, the second opening pattern OPP2 may be spaced apart from one surface of the conductive tape CT in a range of about 0.1 mm to about 0.3 mm along the first direction DR1.

As described above, in the display device 10 according to the invention, a structure in which both the first opening pattern OPP1 and the second opening pattern OPP2 are formed is only an example. The disclosure is not limited thereto, and in another embodiment, the first opening pattern OPP1 may be defined only at the one end portion SPCa of the spacer SPC, and the second opening pattern OPP2 may not be defined at the one end portion CTa of the conductive tape CT. In another embodiment, the second opening pattern OPP2 may be defined only at the one end portion CTa of the conductive tape CT, and the first opening pattern OPP1 may not be defined at the one end portion SPCa of the spacer SPC. Also, the first opening pattern OPP1 and the second opening pattern OPP2 may be defined in different shapes each other.

Hereinafter, effect of the invention will be further described with reference to FIG. 8, Table 1, and Table 2.

Figure 8:
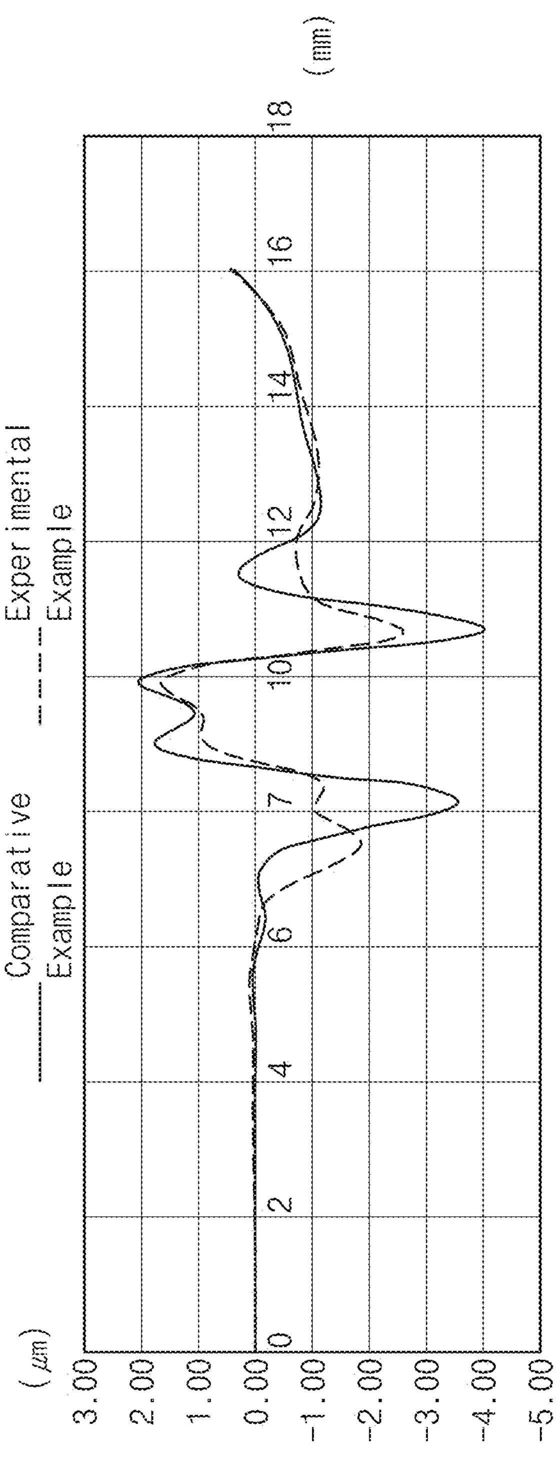
FIG. 8 is a graph illustrating a cross-sectional profile of the adhesive member of FIG. 6.

FIG. 8 is a graph illustrating a cross-sectional profile of the adhesive member of FIG. 6.

In an embodiment, FIG. 8 may illustrate a cross-sectional profile of the adhesive member AM in a state in which the display device 10 of FIG. 6 is vertically inverted, for example. That is, the adhesive member AM of FIG. 8 may be disposed under the display panel PNL, and thus the third direction DR3 may face downward.

Referring further to FIG. 8, a display device was manufactured under the same conditions except for a spacer and a conductive tape. In the display device according to a comparative example, no opening pattern was defined in each of the spacer and the conductive tape, and in the display device according to an experimental embodiment, an opening pattern was defined in each of the spacer and the conductive tape.

Since a maximum value of the adhesive member included in the display device according to the comparative example in a Y direction was about 2 micrometers and a minimum value of the adhesive member included in the display device according to the comparative example in a Y direction was about −4 micrometers, a difference between the maximum value and the minimum value was about 6 micrometers. Since a maximum value of the adhesive member included in the display device according to the experimental embodiment in the Y direction was about 1.6 micrometers and a minimum value of the adhesive member included in the display device according to the experimental embodiment in the Y direction was about −2.6 micrometers, a difference between the maximum value and the minimum value was about 4.2 micrometers. That is, it may be seen that a size of the concavo-convex according to the experimental example is reduced by about 30% compared to a size of the concavo-convex according to the comparative example.

Since the larger the difference between the maximum and minimum values of the concavo-convex, the larger the size and degree of the concavo-convex, it may be seen that the size of the concavo-convex of the adhesive member according to the comparative example is greater than the size of the concavo-convex of the adhesive member according to the experimental embodiment.

Comparative Example 1, Experimental Example 1, Experimental Example 2, Comparative Example 2, Comparative Example 3

Display devices having same conditions except for the first opening pattern of the spacer and the second opening pattern of the conductive tape were manufactured. The opening pattern was not defined in the display device according to Comparative Example 1, and the first opening pattern and a second opening pattern including a row of openings respectively were defined in the display devices according to Experimental Example 1, Experimental Example 2, Comparative Example 2, Comparative Example 3.

The size of each of the openings in the column direction and the maximum and minimum values of the concavo-convex of the adhesive member in the Y direction according to Comparative Examples and Experimental Examples are shown in Table 1 below.

TABLE 1

| | Comparative Example 1 | Experimental Example 1 | Experimental Example 2 | Comparative Example 2 | Comparative Example 3 |
|---|---|---|---|---|---|
| Size of opening (mm) | — | 0.15 | 0.3 | 0.4 | 0.5 |
| Maximum value (μm) | 2.042 | 1.735 | 1.989 | 2.268 | 2.567 |
| Minimum value (μm) | −4.071 | −3.039 | −3.587 | −4.697 | −5.369 |
| Total (μm) | 6.113 | 4.774 | 5.576 | 6.965 | 7.936 |

It may be seen that the size of the concavo-convex of the adhesive member satisfying Experimental Examples 1 and 2 is smaller than the size of the concavo-convex of the adhesive member satisfying Comparative Examples 1 to 3. In addition, it may be seen that the size of the concavo-convex of the adhesive member satisfying Experimental Example 1 is smaller than the size of the concavo-convex of the adhesive member satisfying Experimental Example 2. From Table 1, it may be seen that the size of the concavo-convex increases when the size of the opening is larger than a predetermined size.

Comparative Example 1, Experimental Example 1, Experimental Example 3, Experimental Example 4, Experimental Example 5

Display devices having same conditions except for the first opening pattern of the spacer and the second opening pattern of the conductive tape were manufactured. The opening pattern was not defined in the display device according to Comparative Example 1, and the first opening pattern and a second opening pattern each having a size of about 0.15 mm were defined in the display devices according to Experimental Example 1, Experimental Example 3, Experimental Example 4, Experimental Example 5.

The number of rows included in the opening pattern and the maximum and minimum values in the Y direction of the concavo-convex of the adhesive member according to Comparative Examples and Experimental Examples are shown in Table 2 below.

TABLE 2

| | Comparative Example 1 | Experimental Example 1 | Experimental Example 3 | Experimental Example 4 | Experimental Example 5 |
|---|---|---|---|---|---|
| The number of rows | — | 1 | 2 | 3 | 4 |
| Maximum value (μm) | 2.042 | 1.735 | 1.643 | 1.803 | 1.927 |
| Minimum value (μm) | −4.071 | 3.039 | 2.636 | 3.241 | 3.721 |
| Total (μm) | 6.113 | 4.774 | 4.279 | 5.044 | 5.648 |

It may be seen that the size of the concavo-convex of the adhesive member satisfying Experimental Examples 1, 3, 4 and 5 is smaller than the size of concavo-convex of the adhesive member satisfying Comparative Example 1. In addition, it may be seen that the size of the concavo-convex of the adhesive member satisfying Experimental Example 3 is smaller than the size of the concavo-convex of the adhesive member satisfying Experimental Examples 1, 4, and 5. From Table 2, it may be seen that the size of the concavo-convex is minimized when each of the first and second opening patterns includes openings arranged in two rows.

The disclosure should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a display panel including:

a display area;

a pad area spaced apart from the display area; and a bending area adjacent to the display area in a first direction, disposed between the display area and the pad area, and bent from the display area;

a window member disposed on a first surface of the display panel; and a spacer disposed on a second surface of the display panel opposite to the first surface and overlapping the display area and the pad area, wherein a first opening pattern is defined at an end portion of the spacer, wherein the first opening pattern includes a plurality of first openings arranged in two rows in a plan view, and wherein the two rows are spaced apart from each other by a range of about 0.1 millimeter to about 0.3 millimeter along the first direction which is a column direction.

2. The display device of claim 1, wherein the spacer includes polyethylene terephthalate.

3. The display device of claim 1, wherein a size of each of the plurality of first openings in the first direction is in a range of about 0.1 millimeter to about 0.3 millimeter.

4. The display device of claim 1, further comprising:

a printed circuit board connected to the display panel in the pad area; and a conductive tape disposed between the printed circuit board and the display panel.

5. The display device of claim 4, wherein the conductive tape is disposed on the second surface of the display panel.

6. The display device of claim 4, wherein a second opening pattern is defined at an end portion of the conductive tape.

7. The display device of claim 6, wherein the end portion of the conductive tape is adjacent to the end portion of the spacer.

8. The display device of claim 6, wherein the second opening pattern includes a plurality of second openings arranged in at least one row in a plan view.

9. The display device of claim 8, wherein a size of each of the plurality of second openings in the first direction is in a range of about 0.1 millimeter to about 0.3 millimeter.

10. The display device of claim 8, wherein the plurality of second openings is arranged in two rows, and the two rows are spaced apart from each other by a range of about 0.1 millimeter to about 0.3 millimeter along the first direction which is a column direction.

11. The display device of claim 1, further comprising:

an adhesive member disposed between the window member and the display panel.

12. The display device of claim 11, wherein the adhesive member includes optically clear adhesive.

13. The display device of claim 1, further comprising:

a driving integrated circuit disposed on the first surface of the display panel and overlapping the pad area.

14. A display device comprising:

a display panel including:

a display area;

a pad area spaced apart from the display area; and a bending area adjacent to the display area in a first direction, disposed between the display area and the pad area, and bent from the display area;

a window member disposed on a first surface of the display panel;

a spacer disposed on a second surface of the display panel opposite to the first surface and overlapping the display area and the pad area;

a printed circuit board connected to the display panel in the pad area; and a conductive tape disposed between the printed circuit board and the display panel and disposed on the second surface of the display panel, wherein a first opening pattern is defined at an end portion of the spacer, and a second opening pattern is defined at an end portion of the conductive tape adjacent to the first opening pattern in the first direction.

15. The display device of claim 14, wherein a shape of the first opening pattern and a shape of the second opening pattern are same.

16. The display device of claim 15, wherein each of the first opening pattern and the second opening pattern includes a plurality of openings arranged in at least one row.

17. The display device of claim 16, wherein a size of each of the plurality of openings in the first direction is in a range of about 0.1 millimeter to about 0.3 millimeter.

18. The display device of claim 16, wherein each of the first opening pattern and the second opening pattern includes a plurality of openings arranged in two rows, and the two rows are spaced apart from each other by a range of about 0.1 millimeter to about 0.3 millimeter along the first direction which is a column direction.

* * * * *